US012646679B2

(12) United States Patent
Mangnus et al.

(10) Patent No.: US 12,646,679 B2
(45) Date of Patent: Jun. 2, 2026

(54) APPARATUS FOR AND METHOD OF CONTROL OF A CHARGED PARTICLE BEAM

(71) Applicant: ASML NETHERLANDS B.V., Veldhoven (NL)

(72) Inventors: Albertus Victor Gerardus Mangnus, Eindhoven (NL); Maikel Robert Goosen, Eindhoven (NL); Erwin Paul Smakman, Eindhoven (NL); Yan Ren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 76 days.

(21) Appl. No.: 17/790,097

(22) PCT Filed: Jan. 4, 2021

(86) PCT No.: PCT/EP2021/050030
§ 371 (c)(1),
(2) Date: Jun. 29, 2022

(87) PCT Pub. No.: WO2021/140072
PCT Pub. Date: Jul. 15, 2021

(65) Prior Publication Data
US 2023/0048580 A1 Feb. 16, 2023

(30) Foreign Application Priority Data
Jan. 6, 2020 (EP) ..................................... 20150384

(51) Int. Cl.
*H01J 37/153* (2006.01)
(52) U.S. Cl.
CPC ....... *H01J 37/153* (2013.01); *H01J 2237/151* (2013.01); *H01J 2237/2809* (2013.01)

(58) Field of Classification Search
CPC .............. H01J 37/153; H01J 2237/151; H01J 2237/2809; H01J 2237/1534; H01J 2237/153; H01J 37/04
See application file for complete search history.

(56) References Cited

U.S. PATENT DOCUMENTS 9,040,942 B1 * 5/2015 Standiford .......... H01J 37/3007
250/492.1
2002/0130274 A1 9/2002 Ferrera et al.
(Continued)

FOREIGN PATENT DOCUMENTS

EP 3 474 308 A1 4/2019
EP 3 761 340 A1 1/2021
(Continued)

OTHER PUBLICATIONS

Tromp, R.M., "Catadioptric aberration correction in cathode lens microscopy," Ultramicroscopy, vol. 151, Apr. 2015, pp. 191-198, ScienceDirect (2 pgs.).
(Continued)

Primary Examiner — David E Smith
Assistant Examiner — Christopher J Gassen
(74) Attorney, Agent, or Firm — Finnegan, Henderson, Farabow, Garrett & Dunner LLP

(57) ABSTRACT

An apparatus comprising a set of pixels configured to shape a beamlet approaching the set of pixels and a set of pixel control members respectively associated with each of the set of pixels, each pixel control member being arranged and configured to apply a signal to the associated pixel for shaping the beamlet.

14 Claims, 7 Drawing Sheets

(56)                    References Cited

U.S. PATENT DOCUMENTS

| | | | | |
|---|---|---|---|---|
| 2008/0100816 A1* | 5/2008 | Mulder | ............... | G03F 7/70291 |
| | | | | 355/68 |
| 2009/0296182 A1* | 12/2009 | Novotny | ............ | G02B 26/0841 |
| | | | | 359/225.1 |
| 2010/0065753 A1* | 3/2010 | Enyama | ................ | H01J 37/153 |
| | | | | 250/397 |
| 2013/0248731 A1* | 9/2013 | Tanimoto | .............. | H01J 37/153 |
| | | | | 250/396 R |
| 2016/0172151 A1* | 6/2016 | Bevis | .................. | H01J 37/3175 |
| | | | | 250/505.1 |
| 2019/0131104 A1* | 5/2019 | Shirasaki | ................ | H01J 37/28 |

FOREIGN PATENT DOCUMENTS

| | | | |
|---|---|---|---|
| TW | 2018-39794 A | 11/2018 |
| TW | 2019-40872 A | 10/2019 |

OTHER PUBLICATIONS

Roelofs, B. J. G. M. et al., "Feasibility of multi-beam electron lithography," Microelectronic Engineering 2 (1984) 259-279, North-Holland (21 pgs.).
Grella, L. et al., "Digital pattern generator: an electron-optical MEMS for massively parallel reflective electron beam lithography," Journal of Micro/Nanolithography, MEMS, and MOEMS (12 pgs.).
Office Action issued by the Intellectual Property Office (IPO) in related Application No. TW 109146793, mailed Nov. 5, 2021 (22 pgs.).
International Search Report from the International Search Authority issued in related International Application No. PCT/EP2021/050030 mailed Mar. 31, 2021 (3 pgs.).

* cited by examiner

100C

500

510 — Direct a beamlet towards a programmable charged-particle mirror plate

520 — Provide signals to pixels of the programmable charged-particle mirror plate to shape the directed beamlet 530 — Reflect the shaped beamlet by the programmable charged-particle mirror plate

APPARATUS FOR AND METHOD OF CONTROL OF A CHARGED PARTICLE BEAM

CROSS-REFERENCE TO RELATED APPLICATIONS

This application claims priority to International Application No. PCT/EP2021/050030, filed Jan. 4, 2021, and published as WO 2021/140072 A1, which claims priority of EP Application Serial No. 20150384.4 which was filed on Jan. 6, 2020. The contents of these applications are incorporated herein by reference in their entireties.

TECHNICAL FIELD

The embodiments described herein relate to a charged particle device with one or more charged particle beams, such as an electron microscopy apparatus utilizing one or more electron beams.

BACKGROUND

Integrated circuits are made by creating patterns on a wafer, also called a substrate. The wafer is supported on a wafer stage in the equipment for creating the pattern. One part of the process for making the integrated circuits involves looking at or "inspecting" parts of the wafer. This may be done with a charged particle system such as a scanning electron microscope or SEM.

Traditional microscopes use visible light and a transparent lens or lenses or reflective mirror(s) to render objects as small as about one micrometer visible. The resolving power of such a microscope is limited by the wavelength of the light used for illumination. Charged particle systems use a beam of charged particles instead of light and use electromagnetic or electrostatic lenses to focus the particles. They can measure positions with a precision as small as one-tenth of a nanometer.

Typically a system for focusing charged particles at a single point on a sample uses two or more electromagnetic or electrostatic lenses. Real lenses, however, do not focus exactly to a single point. The second lens, for example, may distort the wavefront of the charged particle beam. These deviations from the perfect lens are called aberrations of the lens. Aberrations cause the image formed by a lens to be blurred or distorted. Aberrations may be reduced with for example a phase plate with multiple apertures, but this comes at the cost of reduced beam current.

SUMMARY

The embodiments of the present disclosure provide a multi-beam inspection apparatus, and more particularly a single-beam or multi-beam inspection system including an improved beam manipulation unit. In some embodiments, the inspection system includes a source of a beamlet of charged particles, a beam separator for directing the beamlet, and a programmable charged-particle mirror plate arranged to receive the plurality of beamlets from the beam separator and configured to correct aberrations of the beamlets. The mirror plate comprises a first set of pixels configured to shape a first beamlet approaching the first set of pixels and a first set of pixel control members respectively associated with each of the first set of pixels, each pixel control member being arranged and configured to apply a signal to the associated pixel for shaping the first beamlet.

In some embodiments, a system for manipulating a charged particle beam is provided. The system includes a source of a beamlet of charged particles, a beam separator for directing the beamlet, and a programmable charged-particle mirror plate arranged to receive the directed beamlet from the beam separator and configured to shape the beamlet.

In some embodiments, a method for shaping a beamlet of charged particles is provided. The method includes directing, using a beam separator, a first beamlet of charged particles towards a charged-particle mirror plate and shaping the first beamlet by providing signals to a first set of pixels of the charged-particle mirror plate to generate an electric field and reflecting the shaped beamlet to the beam separator by the charged-particle mirror plate.

In some embodiments, a non-transitory computer-readable medium storing instructions to execute a method by a processor to shape a beamlet of charged particles is provided. The method includes directing, using a beam separator, a first beamlet of charged particles towards a charged-particle mirror plate and shaping the first beamlet by providing signals to a first set of pixels of the charged-particle mirror plate to generate an electric field and reflecting the shaped beamlet to the beam separator by the charged-particle mirror plate.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
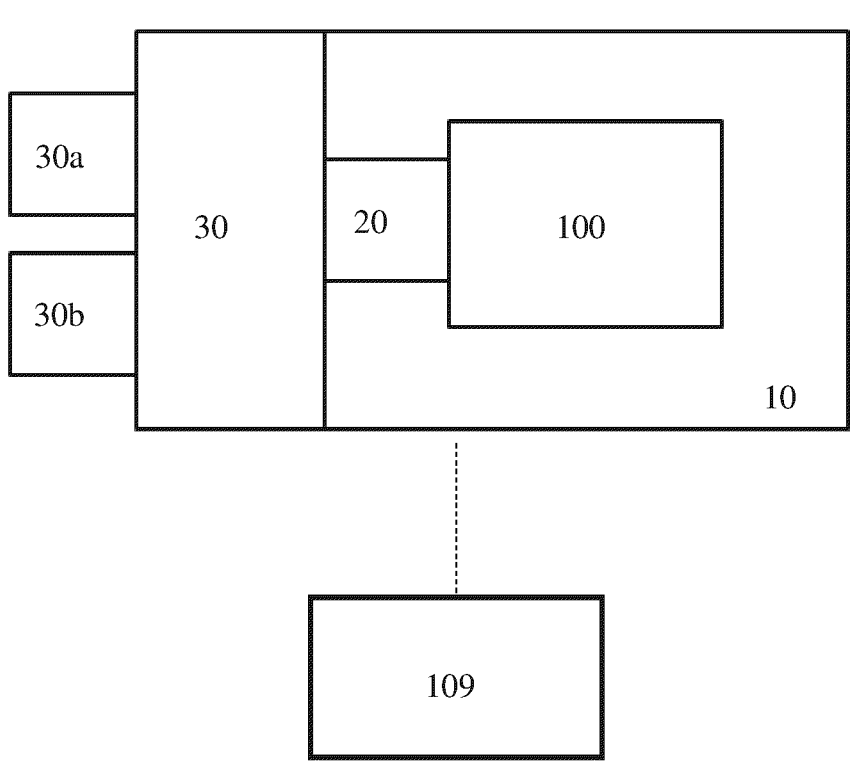
FIG. 1 is a schematic diagram illustrating an exemplary charged particle beam inspection system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatus, and methods consistent with aspects related to the invention as recited in the appended claims. Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

An image of a wafer may be formed by scanning a primary beam of a SEM system over the wafer and collecting particles (e.g., secondary electrons) generated from the wafer surface at a detector. The process of imaging may include focusing the primary beam to a point, and deflecting (e.g., bending) the beam so that it passes over regions of the wafer in a line-by-line pattern (e.g., a raster scan). At a given time, the beam may be focused to a particular position on a wafer, and output of the detector at this time may be correlated to that particular position on the wafer. An image may be reconstructed based on detector output at each time along the beam scan path.

Factors that affect the quality of imaging (e.g., the quality of the picture produced by the SEM) include imaging resolution. The imaging resolution may depend on the ability of the beam to be focused to a point. As feature sizes on IC chips continues to decrease, e.g., to 5 nm and 3 nm node sizes, resolution becomes increasingly important. Resolution may be affected by various kinds of distortion or aberrations that may be introduced in a SEM system. Aberrations, such as field curvature aberration, astigmatism aberration, and chromatic aberration, may be caused when a beam travels through a lens.

To address aberrations, existing systems may use for example a programmable phase plate comprising apertures. Each of the apertures is connected to a voltage configured to supply voltages to the corresponding aperture to correct aberrations of the beam passing through the aperture. While the programmable phase plate may reduce aberrations, it results in a loss of beam current when the part of the beam does not fall on one of the apertures. The beam transmission loss may further limit the throughput of a SEM system.

To enhance performance of a SEM system, it would be desirable to correct for aberration without reducing beam current, and without inhibiting the operation flexibility of the SEM system. For example, it may be desirable to maintain a wide range of adjustability of parameters of a SEM system, such as primary beam energy, beam opening angle, and energy of secondary electrons arriving on a detector.

Embodiments of the disclosure may address issues such as those discussed above by reducing the effect of aberrations. Aberrations may be reduced without substantial beam current loss and without compromising adjustability of operation parameters. For example, after a beam passes through a lens, the beam may be shaped to correct for any aberrations introduced by the lens. The shaping can be performed by a mirror plate.

An exemplary mirror plate may comprise a set of pixels, wherein each pixel is associated with a voltage control. The voltage control provides a voltage to the corresponding pixel, thereby affecting the charged particles of the beam when they are near the pixel. By affecting the charged particles, the pixels of the mirror plate assist with shaping the beam or correcting aberrations introduced by the lens.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to ions, etc. Furthermore, the term "beam" may refer to primary electron beams, primary electron beamlets, secondary electron beams, or secondary electron beamlets, among others.

Reference is now made to FIG. 1, which is a schematic diagram illustrating an exemplary charged particle beam inspection system 1, consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 may be connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. In some embodiments, electron beam tool 100 may comprise a single-beam inspection tool. In other embodiments, electron beam tool 100 may comprise a multi-beam inspection tool.

A controller 109 is electronically connected to electron beam tool 100. Controller 109 may be a computer config-ured to execute various controls of charged particle beam inspection system 1. Controller 109 may also include a processing circuitry configured to execute various signal and image processing functions. While controller 109 is shown in FIG. 1 as being outside of the structure that includes main chamber 10, load/lock chamber 20, and EFEM 30, it is appreciated that controller 109 may be part of the structure. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools that operate under the second pressure.

Figure 2A:
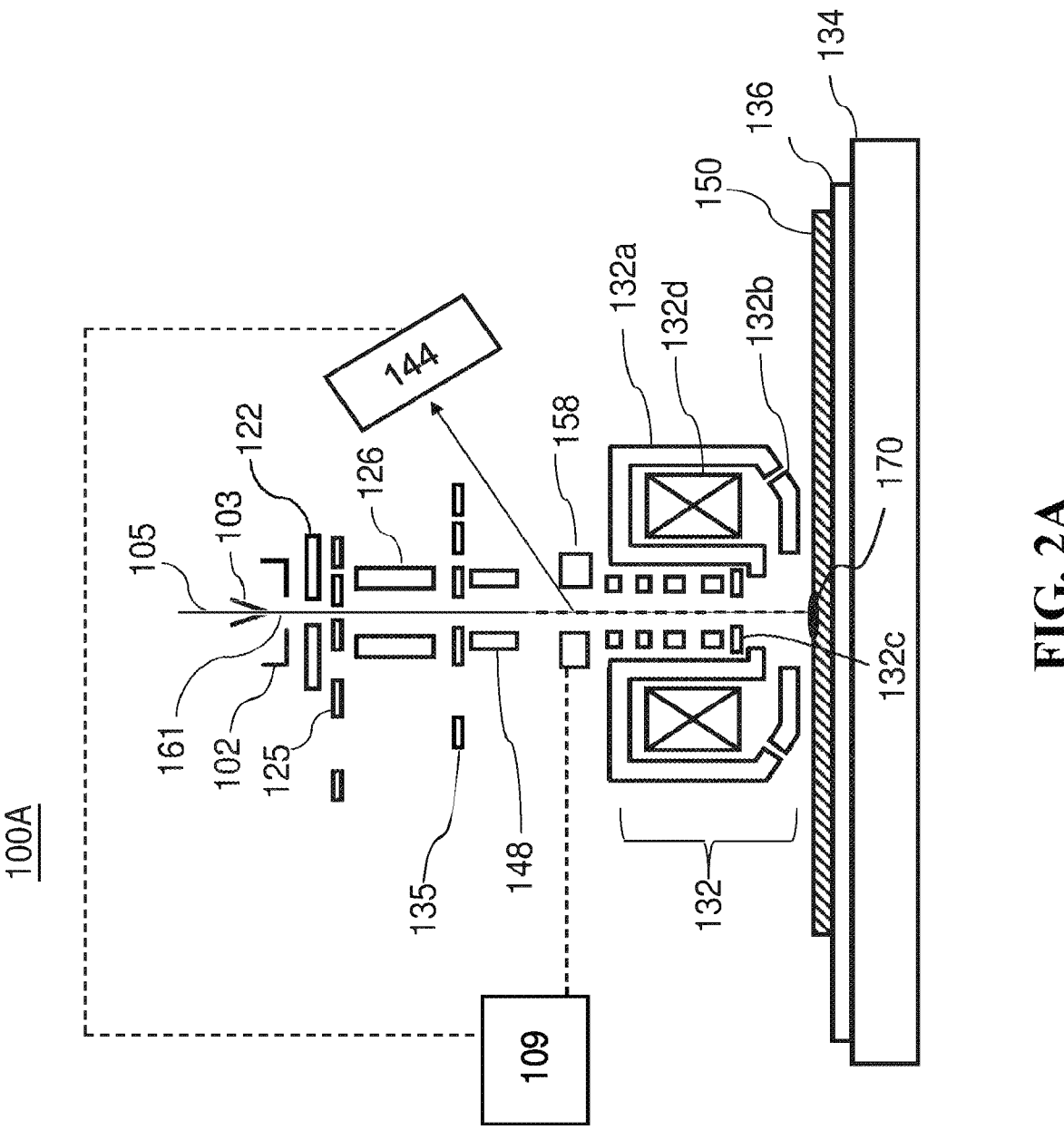
FIG. 2A is a diagram illustrating a charged particle beam apparatus that may be an example of an electron beam tool, consistent with embodiments of the present disclosure that may be a part of the exemplary charged particle beam inspection system of FIG. 1.

FIG. 2A illustrates a charged particle beam apparatus that may be an example of electron beam tool 100, consistent with embodiments of the present disclosure. Electron beam tool 100A (also referred to herein as apparatus 100A) may be a single-beam SEM tool that is used in charged particle beam inspection system 1. Apparatus 100A may include a primary beam source that includes an anode 102 and a cathode 103. A voltage may be applied between anode 102 and cathode 103 and a primary beam 161 may be emitted along an axis 105. Axis 105 may be the primary optical axis of the SEM.

Primary beam 161 may pass through a gun aperture 122 and a beam limit aperture 125. Beam limit aperture 125 may include an adjustable aperture plate. Gun aperture 122 and beam limit aperture 125 may determine the size of an electron beam entering a condenser lens 126. Condenser lens 126 may be provided below (e.g., downstream from) beam limit aperture 125. Condenser lens 126 may be con-figured to focus primary beam 161 before it enters a column aperture 135. Column aperture 135 may also include an adjustable aperture plate.

In some embodiments, apparatus 100A may include an additional lens 148 for manipulating primary beam 161. For example, lens 148 may be controlled to adjust beam current. Lens 148 may also include another lens that may be con-trolled to adjust beam spot size and beam shape. For example, these lenses of lens 148 can be any type of lens, such as a quadrupole lens.

Beam current of primary beam 161 may be determined by apertures, including gun aperture 122, beam limit aperture 125, and column aperture 135, and lenses, including con-denser lens 126 and quadrupole lens 148.

As shown in FIG. 2A, apparatus 100A may include a motorized stage 134 and a wafer holder 136 supported by motorized stage 134 to hold a wafer 150 to be inspected. Apparatus 100A further includes an objective lens assembly 132, a beam separator 158, and a detector 144. Objective lens assembly 132, in some embodiments, may include a modified swing objective retarding immersion lens (SORIL) that includes a pole piece 132a, a control electrode 132b, a deflector 132c, and an exciting coil 132d. Apparatus 100A may additionally include an energy dispersive X-ray spec-trometer (EDS) detector (not shown) that may be used to characterize the materials on the wafer.

In operation, apparatus 100A may be used to inspect wafer 150 mounted on wafer holder 136. Primary beam 161 may travel through the SEM column of apparatus 100A. Deflector 132c may deflect primary beam 161 to scan across locations on a surface of wafer 150. In the objective lens assembly 132, exciting coil 132d and pole piece 132a may generate a magnetic field that begins at one end of pole piece 132a and terminates at the other end of pole piece 132a. Control electrode 132b may be electrically isolated from pole piece 132a and may control an electric field that affects beam focus. Primary beam 161 may be projected on wafer 150 and may form a beam spot 170.

Secondary particles, such as secondary electrons or back-scattered electrons, may be emitted from the part of wafer 150 illuminated by primary beam 161 (e.g., at beam spot 170). Beam separator 158 may direct the secondary particles traveling back from wafer 150 to a sensor surface of detector 144. Beam separator 158 may change the direction of beams. Beam separator 158 may change the direction of beams selectively, for example based on velocity or energy of beams passing through beam separator 158. Beam sepa-rator 158 may be configured to change the direction of a beam of secondary particles directed back from wafer 150 toward beam separator 158 so that it is directed toward detector 144, while the trajectory of primary beam 161 is not altered as it passes through beam separator 158. For example, beam separator 158 may be aligned with axis 105 and may allow primary beam 161 to travel along axis 105 while a beam of secondary particles is diverted away from axis 105. In some embodiments, beam separator 158 may be configured to deflect primary beam 161 while beams of secondary particles are allowed to travel back from wafer 150 through beam separator 158 without having their tra-jectory changed. In some embodiments, beam separator 158 may be configured to deflect primary beam 161 and beams of secondary particles. Beam separator 158 may include a component that generates a magnetic field. Beam separator 158 may be connected to controller 109 and may be operated based on signals transmitted from controller 109.

Detector 144 may generate signals (e.g., voltages, cur-rents, etc.) that represent the intensities of the received charged particles, and provide the signals to a processing system, such as controller 109. As shown in FIG. 2A, detector 144 may be connected to controller 109. The intensity of a beam of secondary particles, and the resultant beam spot on detector 144, may vary according to the external or internal structure of wafer 150. Moreover, as discussed above, primary beam 161 may be projected onto different locations of the top surface of wafer 150 to generate beams of secondary particles (and resultant beam spots) of different intensities. Therefore, by mapping the intensities of the beam spots with the locations of wafer 150, the process-ing system may reconstruct an image that reflects the internal or external structures of wafer 150. Controller 109 may include an image processing system.

Figure 2B:
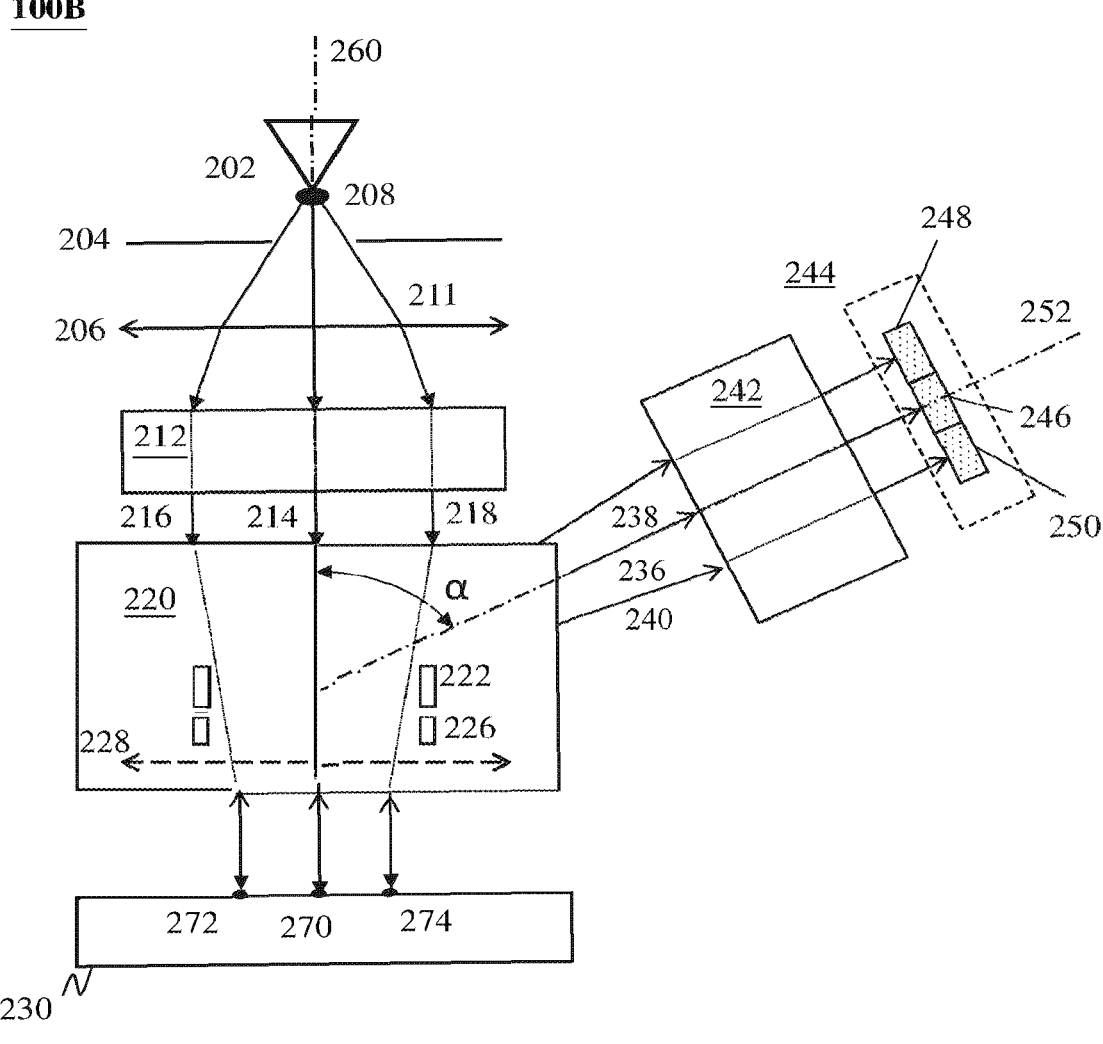
FIG. 2B is a diagram illustrating a multi-beam charged particle beam apparatus that may be an example of an electron beam tool, consistent with embodiments of the present disclosure that may be a part of the exemplary charged particle beam inspection system of FIG. 1.

FIG. 2B illustrates a charged particle beam apparatus that may be an example of electron beam tool 100, consistent with embodiments of the present disclosure. Electron beam tool 100B (also referred to herein as apparatus 100B) may be a multi-beam tool that is used in charged particle beam inspection system 1. Apparatus 100B may include an elec-tron source 202. Electron source 202 may be configured to generate an electron beam along a primary optical axis 260.

As shown in FIG. 2B, apparatus 100B may include electron source 202, a gun aperture 204, a condenser lens 206, a primary electron beam 211 emitted from electron source 202, a source conversion unit 212, a plurality of beamlets 214, 216, and 218 of primary electron beam 211, a primary projection optical system 220, a wafer stage (not shown in FIG. 2B), multiple secondary electron beams 236, 238, and 240, a secondary optical system 242, and electron detection device 244. Electron source 202 may generate primary particles, such as electrons of primary electron beam 211. A controller, image processing system, and the like may be coupled to electron detection device 244. Primary projection optical system 220 may comprise beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with primary optical axis 260 of apparatus 100B. Secondary optical system 242 and electron detection device 244 may be aligned with a secondary optical axis 252 of apparatus 100B.

Electron source 202 may comprise a cathode, an extractor or an anode, wherein primary electrons can be emitted from the cathode and extracted or accelerated to form a primary electron beam 211 with a crossover (virtual or real) 208. Primary electron beam 211 can be visualized as being emitted from crossover 208. Gun aperture 204 may block off peripheral electrons of primary electron beam 211 to reduce size of probe spots 270, 272, and 274.

Source conversion unit 212 may comprise an array of image-forming elements (not shown in FIG. 2B) and an array of beam-limit apertures (not shown in FIG. 2B). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 211. The array of beam-limit apertures may limit the plurality of beamlets 214, 216, and 218.

Condenser lens 206 may focus primary electron beam 211. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be an adjustable condenser lens that may be configured so that the position of its first principle plane is movable. The adjustable condenser lens may be configured to be magnetic, which may result in off-axis beamlets 216 and 218 landing on the beamlet-limit apertures with rotation angles. The rotation angles change with the focusing power and the position of the first principal plane of the adjustable condenser lens. In some embodiments, the adjustable condenser lens may be an adjustable anti-rotation condenser lens, which involves an anti-rotation lens with a movable first principal plane. Examples of an adjustable condenser lens are further described in U.S. Publication No. 2017/0025241, which is incorporated by reference in its entirety.

Objective lens 228 may focus beamlets 214, 216, and 218 onto wafer 230 for inspection and may form a plurality of probe spots 270, 272, and 274 on the surface of wafer 230.

In some embodiments, condenser lens 206 can distort the wavefront of each of beamlets 214, 216, and 218. As a complement, objective lens 228 can be configured to focus a representation of the wavefront onto the surface of wafer 230, thereby imaging electron source 202. But aberrations introduced by objective lens 228 can distort the shape of the wavefront to deviate from an ideal shape, causing blurring of the image on the surface.

Beam separator 222 may be a beam separator of Wien filter type generating an electrostatic dipole field and a magnetic dipole field. In some embodiments, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 242. Beam separator 222 may direct beamlets toward secondary optical system 242 by deflecting them by an angle α relative to primary optical axis 260.

Deflection scanning unit 226 may deflect beamlets 214, 216, and 218 to scan probe spots 270, 272, and 274 over an area on the surface of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of the surface of wafer 230.

Figure 3A:
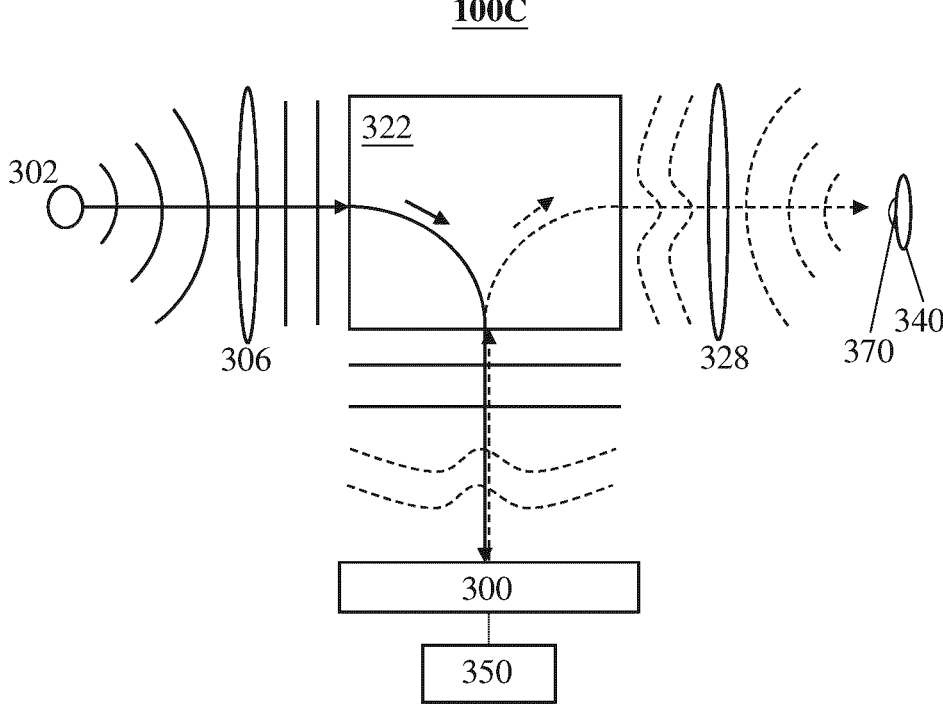
FIG. 3A illustrates an exemplary electron beam tool that may be part of the charged particle beam inspection system of FIG. 1, consistent with embodiments of the present disclosure.

FIG. 3A illustrates an exemplary electron beam tool 100C that may be part of the charged particle inspection system of FIG. 1, consistent with embodiments of the present disclosure. An electron beam tool 100C (also referred to herein as apparatus 100C) comprises an electron source 302, a first lens 306, a second lens 328, a beam separator 322, a programmable charged-particle mirror plate 300, and a voltage control 350. Other components commonly present such as apertures and deflectors are not shown in FIG. 3A for the purpose of simplicity. A sample 340 with sample surface 370 may be provided on a movable stage (not shown). Electron source 302, lens 306, and lens 328 may be aligned with a primary optical axis of apparatus 100C.

Electron source 302 may comprise a cathode (not shown) and an extractor or anode (not shown), in which, during operation, electron source 302 is configured to emit primary electrons from the cathode and the primary electrons are extracted or accelerated by the extractor or the anode to form a primary electron beam shown as a series of wavefronts, that is, surfaces, surface, real or imaginary, at which the phase of oscillation is the same. As can be seen, the wavefront of the beam as emitted by the source 302 is shown to be essentially spherical.

Beam separator 322, mirror plate 300, and voltage control 350 are introduced into the beam path to correct for aberrations. Beam separator 322, mirror plate 300, and voltage control 350 are introduced between the lenses to pre-shape the wavefront so that the net effect of the pre-shaping and aberrations is a more properly focused beam. It will be understood as described in more detail below that the placement of beam separator 322, mirror plate 300, and voltage control 350 in apparatus 100C is merely an example, and that beam separator 322, mirror plate 300, and voltage control 350 may be placed in other positions in the apparatus 100C. Beam separator 322 can function similar to beam separator 222 in FIG. 2B and can guide an incoming beamlet towards mirror plate 300 and further guide a reflected beam from mirror plate 300 into another direction. Mirror plate 300 can correct aberrations of the incoming beamlet and reflect the corrected beamlet toward beam separator 322.

Also, in the examples described below, mirror plate 300 is described primarily in terms of correcting aberrations created by lenses. Mirror plate 300 can also or alternatively, however, be used to shape the charged particle beam. For example, mirror plate 300 may be used to make the beam cross-sectional profile ring-shaped instead of spot-shaped on the sample. This may provide advantages in certain applications such as for imaging the side walls of contact holes. As another example, the beam profile could be made to diverge less at the wafer to create a larger depth-of-focus.

In some embodiments, apparatus 100C may comprise additional optical elements (such as electrodes) paired with adjustable voltages or magnetic optical elements paired with adjustable excitation placed between mirror plate 300 and the separator 322 to further influence electric and magnetic fields to correct aberrations. A plurality of drivers can be coupled with electrodes or magnetic optical elements, wherein each of the plurality of drivers can be configured to provide adjustable voltages or adjust excitations to the corresponding electrode or the corresponding magnetic optical element, respectively. The additional optical elements, coupled with mirror plate 300, can be used to correct for possible additional aberrations caused by lens 306 or beam separator 322, like those caused by multipole fields. For instance, in one example implementation, mirror plate 300 can be used to correct rotational symmetric aberrations or non-symmetric aberrations, while the additional optical elements can be used to correct non-symmetric aberrations caused by multipole fields.

Mirror plate 300 may reflect the beamlet above the mirror surface by applying a negative or positive overall voltage on mirror plate 300. For example, voltage control 350 may apply negative overall voltage to mirror plate 300 to reflect electrons (or negative ions) from the beamlet. In another example, voltage control 350 may apply positive overall voltage to mirror plate 300 to reflect positively charged particles (or positive ions) from the beamlet. The beamlet is reflected toward beam separator 322, where the reflected beamlet is guided into another direction and can be focused on a sample. FIG. 3A shows a beamlet that is bent at 90 degrees, and it is appreciated that the beamlet can be bent at other angles. Moreover, mirror plate 300 can be further configured to reflect only one of multiple beamlets.

In some embodiments, mirror plate 300 and voltage control 350 may be implemented in separate components. In some other embodiments, mirror plate 300 and voltage control 350 may be implemented in a single component.

In some implementations, a second mirror plate can be provided to reflect a beamlet which has been reflected by mirror plate 300 inside apparatus 100C. For example, a reflected beamlet from mirror plate 300 can be directed to a second mirror plate implemented within apparatus 100C, such as near to beam separator 322. The second mirror plate may reflect an incoming beamlet from beam separator 322 toward a second beam separator, wherein the second beam separator guides the reflected beamlet into another direction and can be focused on a sample.

Figure 3B:
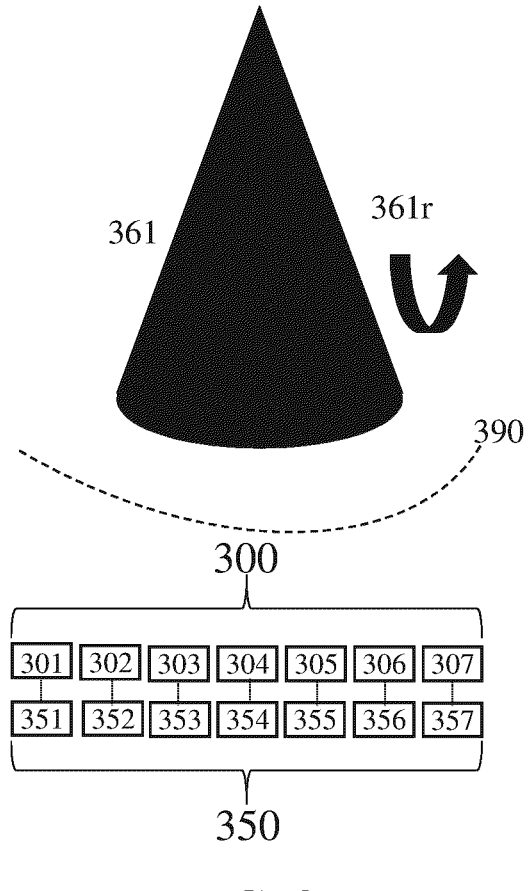
FIG. 3B is a schematic diagram illustrating a functioning of a programmable pixelized mirror plate and a voltage control, consistent with embodiments of the present disclosure.

Reference is now made to FIG. 3B, which is a schematic diagram illustrating a functioning of a programmable pixelized mirror plate 300 and a voltage control 350, consistent with embodiments of the present disclosure. Mirror plate 300 may comprise a set of pixels 301-307 to shape a profile of a beamlet approaching the set of pixels. Voltage control 350 may comprise a set of control members 351-357 respectively associated with each of the set of pixels 301-307. Each pixel control member 351-357 is arranged and configured to apply a signal (e.g., voltage) to the associated pixel. Mirror plate 300 is thus programmable in that the voltages can be provided differently for each pixel or groups of pixels and can be changed as desired. Voltages provided by each of the pixel control member 351-357 may generate curved equipotential planes (customized electric fields) 390 above the mirror plate 300. The equipotential planes 390 may determine where electrons from different parts of beamlet 361 are reflected and the reflection influences a shape and phase of beamlet 361r reflected by mirror plate 300. Thus, the adjustment of voltages controls aberrations by adjusting beamlet 361 locally (i.e., one or more locations where beamlet 361 is influenced by equipotential planes 390) and enables the reflected beamlet 361r to attain a desired characteristic or characteristics, such as focusing at a point on a sample with a desired resolution. While mirror plate 300 is arranged with seven pixels and corresponding seven control members, it is appreciated that different number of pixels and control members may be arranged, and that the pixels or control members may be arranged in any of various arrangements.

In some embodiments, pixels 301-307 and corresponding pixel control members 351-357 may each be implemented in separate components. In other embodiments, pixels 301-307 and corresponding pixel control members 351-357 may be implemented in a single component.

Pixels 301-307 may each comprise a rectangular shape. It will be apparent that the pixels may comprise other shapes, such as hexagonal, ring segment, square, another suitable shape, or combinations of these. For example, a beamlet is often rotational symmetric, thus using a pixel shared as a ring segment may provide an advantage of decreasing a number of voltage controls and pixels needed. By way of further example, more pixels can be implemented in the same area by using hexagonal pixels instead of square pixels.

In some embodiments, the sizes of the pixels or shapes of pixels 301-307 may vary over the mirror plate 300. For example, smaller pixels may be used in areas of mirror plate 300 where more precise correction is needed, and can resultingly provide more accuracy in correcting for aberrations. Voltage control 350 can provide voltages to each of these corresponding smaller pixels to provide for a more accurate beam shape. In some embodiments, each of pixels 301-307 can be uniquely controlled. For example, voltage control can provide e.g. negative voltage to some pixels to reflect negatively charged particles interacting with those pixels, and can provide positive voltage to other pixels to attract charged particles that may fall outside of the beam shaped preferred for that instance.

In some implementations, mirror plate 300 may include larger pixels to make the beam shaping easier to control and implement. For example, the larger pixels can each cover a larger area than a smaller pixel and can provide a similar influence (e.g., such as reflection or attraction) on the incoming beamlet. In some implementations, mirror plate 300 may include larger and smaller pixels, where larger pixels can be used in portions of the mirror plate that are expected to consistently reflect beamlets and smaller pixels in the portions of the mirror plate that may be on the peripherals of where an expected beamlet may interact with in order to give more control to the beam shape In some embodiments, mirror plate 300 may be curved. When mirror plate 300 is curved, the voltage used to correct aberrations may be reduced. The mirror curvature may be mechanically adjusted and controlled by mechanical actuators such as piezo motors.

In some embodiments, individual pixels implemented in mirror plate 300 may be tilted by using the individual pixels with a mechanically tiltable upper surface. The tiltable pixels may be mechanically adjusted and controlled by mechanical actuators such as piezo motors. The tilted pixels may remove charged particles from an incoming beamlet and the removed charged particles can be scattered between mirror plate 300 and a beam separator. The tilted pixels may create a different path for the charged particles, wherein the different path may can be used to filter the charged particles out of the incoming beamlet with a beam aperture between mirror plate 300 and a beam separator or elsewhere in the charged particle beam system.

During use, the focused electron beam is scanned across the surface of the sample. During scanning of a focused e-beam over a large field-of-view, the shape and intensity distribution of the image of the source on the surface of the sample, e.g. the spot profile, may change. The use of a programmable mirror plate 300 provides the ability to correct for or reduce these scanning effects by configuring the programmable mirror plate 300 dynamically. As set forth above the programmable mirror plate 300 may be configured as a plate with pixels 301-307 with a separate voltage control 351-357 for each pixel. Using voltage control 350 to adjust the voltage at a pixel can change the phase of the electron wave locally, wherein voltage control 350 may provide AC voltage to pixels to generate a time-dependent beam shape by variably reflecting an incoming beamlet. For example, the portion of the electron wave reflecting above a pixel can enable or facilitate control of the electron spot (probe) formation. As a specific example, synchronizing the mirror plate voltages with the scanning of the e-beam over the sample enables or facilitates dynamic control of probe formation over the entire scanned field-of-view. In another example, more aberrations may appear in an outside edge of a beamlet as compared to the center when scanning a large field of view on a sample. By applying AC voltage to the mirror plate 300, aberrations in the outside edge of the beamlet can be more precisely corrected.

In some embodiments, mirror plate 300 may provide using pixel voltage distributions that are different in different directions over the surface of mirror plate 300. Beam separator 322 may add aberrations to a beamlet and the aberrations could be non-rotational symmetric because the beamlet is deflecting in one direction. Thus, the beamlet is losing rotational symmetric beam shape and to correct the shape, the mirror plate may use different pixel voltage distributions in two different directions.

Figure 3C:
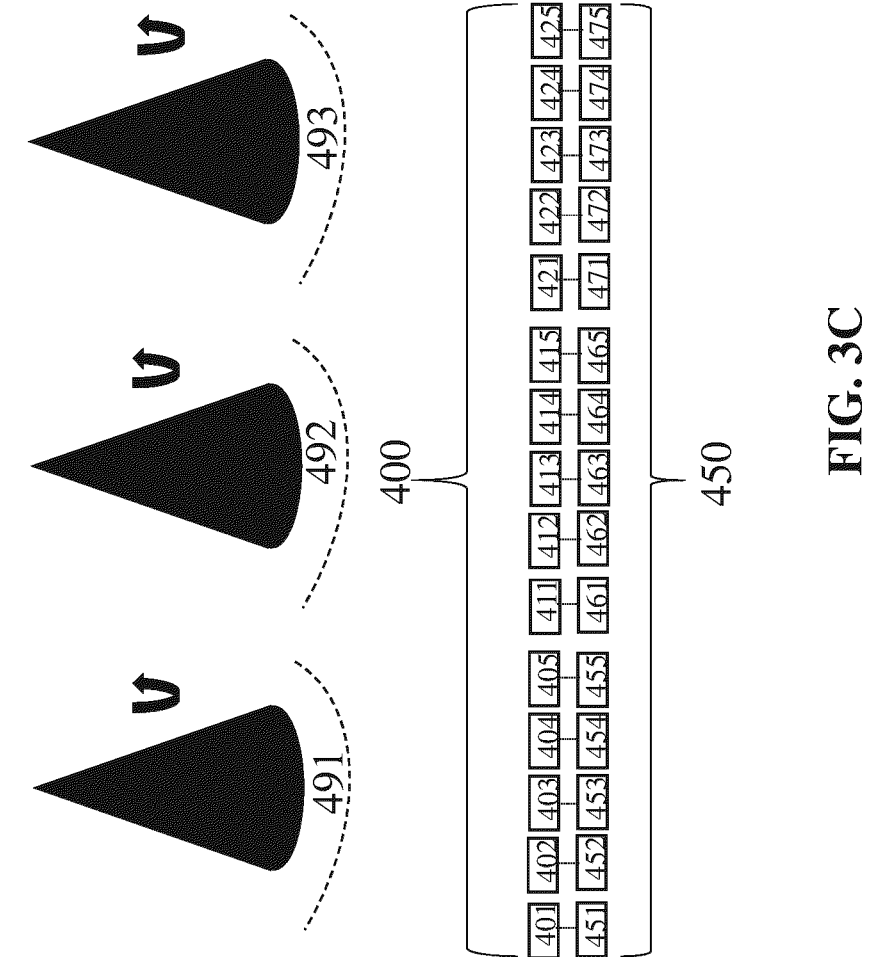
FIG. 3C is another schematic diagram illustrating a functioning of a programmable pixelized mirror plate and a voltage control for correcting different aberrations of different beamlets in a multibeam system, consistent with embodiments of the present disclosure.

Reference is now made to FIG. 3C, which is another schematic diagram illustrating a functioning of a programmable pixelized mirror plate 400 and a voltage control 450 for correcting different aberrations of different beamlets in a multibeam system, consistent with embodiments of the present disclosure. Mirror plate 400 may comprise three sets of pixels 401-405, 411-415, and 421-425, and voltage control 450 may comprise three sets of control members 451-455, 461-465, and 471-475 respectively associated with each of the sets of pixels. Each pixel control member 451-455, 461-65, and 471-475 is arranged and configured to apply a signal (e.g., voltage) to the associated pixel. Voltages provided by each of the pixel control member 451-455, 461-465, and 471-475 may generate corresponding three curved equipotential planes 491-493 (customized electric fields) above the mirror plate 400. The equipotential planes may determine where electrons from different parts of the three beamlets are reflected and the reflection influences a shape and phase of each of the beamlets reflected by mirror plate 400.

Each set of pixels implemented in mirror plate 400 may further reflect a beamlet at different heights above the surface of mirror plate 400 by providing different voltages to each set of pixels. Thus, mirror plate 400 may influence a shape and phase of each of multiple beamlets and reflect the influenced beamlets toward a beam separator in different angles to enable a SEM to attain a desired characteristic or characteristics, such as focusing at a different point on a sample for each of the beamlets with a desired resolution. Moreover, mirror plate 400 may locally control the amplitude of the electron waves in addition to or instead of controlling the phase by removing charged particles locally from parts of an incoming beamlet. Mirror plate 400 may achieve the control of the amplitude by preventing charged particles in the beamlet from being reflected toward a beam separator, for example, by attracting the charged-particles to the pixels, instead of reflecting them.

In some embodiments, mirror plate 400 may remove electrons locally from a beamlet by using a positive voltage on a pixel. The positively charged pixel may attract the electrons above the pixel toward mirror plate 400 and absorb or scatter the electrons on the surface of mirror plate 400.

Mirror plate 400 may also remove positively charged particles in a beamlet by using a negative voltage on a pixel. Scattered particles or secondary electrons originating from mirror plate 400 can have a different path between mirror plate 400 and a beam separator, and can be filtered out by placing a beam aperture at a suitable location between mirror plate 400 and the beam separator or elsewhere in a charged particle beam system.

The voltage distribution over the pixels may be different for each set of pixels assigned for a particular beamlet or for each mirror plate. In some embodiments, voltage distributions may be the same for certain sets of pixels or mirror plates to limit the number of separate voltage controls needed.

The voltage distributions over the pixels and the overall mirror plate voltage may be adjusted as a function of the landing energy of the beamlets to enable correction or reduction of aberrations at the different e-beam system settings related to different landing energies. The voltage distributions over the pixels may be adjusted as a function of the position of the beamlets on the sample. For example, the position of the beamlet could be a measure of whether or to what extent the beamlet is off-axis from a desired beam spot to optimize correction or reduction of aberrations at various off-axis positions of the beamlets.

The voltage distributions over the pixels and overall mirror plate voltage may be adjusted as a function of the beam current of the beamlets to enable correction or reduction of aberrations at the different e-beam system settings related to different beamlet currents. The voltage distributions over the pixels and the overall mirror plate voltage may be adjusted as a function of the landing angle of the beamlets at the sample to enable correction or reduction of aberrations at the different e-beam system settings related to different landing angles.

The voltage distributions over the pixels and the overall mirror plate voltage may be adjusted as a function of the electrical field at the sample to enable correction or reduction of aberrations at the different e-beam system settings related to different electrical fields at the sample.

While mirror plate 400 of FIG. 3C is arranged with three sets of pixels and associated three control members to correct aberrations for three beamlets, it is appreciated that different number of sets of pixels, control members, and beamlets may be arranged in any of various arrangements.

Figure 4:
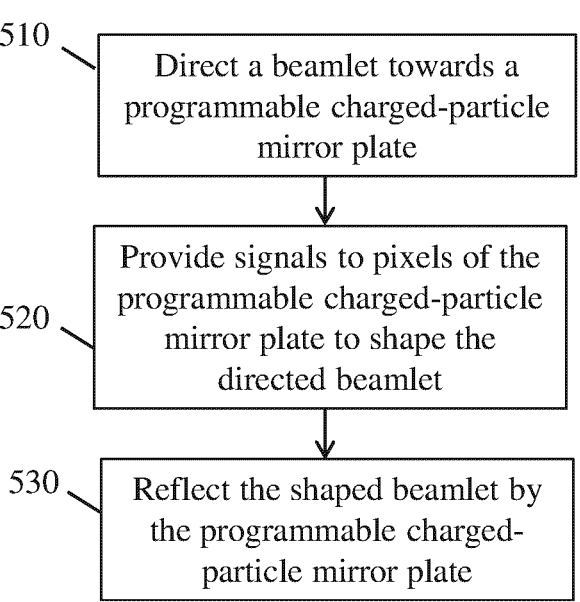
FIG. 4 is a flow chart illustrating an exemplary method of correcting aberrations of a beamlet, consistent with embodiments of the present disclosure.

Reference is now made to FIG. 4, which is a flow chart illustrating an exemplary method 500 of correcting aberrations of a beamlet, consistent with embodiments of the present disclosure. Method 500 may be performed by an electron beam tool (e.g., electron beam tool 100C of FIG. 3A). Moreover, while method 500 describes correcting aberrations for a beamlet, it is appreciated that method 500 can also apply to correcting aberrations for a plurality of beamlets.

In step 510, a beamlet is directed towards a programmable charged-particle mirror plate (e.g., programmable charged-particle mirror plate 300 of FIG. 3A). For example, the beamlet could be directed by a beam separator (e.g., beam separator 322 of FIG. 3A). In some embodiments, a controller (e.g., controller 109 of FIG. 1) can instruct the beam separator to direct the beamlet to the programmable charged-particle mirror plate.

In step 520, signals (e.g., voltages) are provided to pixels (e.g., pixels 301-307 of FIG. 3B) of the programmable charged-particle mirror plate. In some embodiments, these signals may be provided by a voltage control (e.g., voltage control 350 of FIG. 3A), wherein each pixel may have a corresponding voltage control (e.g., voltage control 251-257 of FIG. 3B). In some embodiments, the provided signals can be negative voltages to reflect electrons (or negative ions) and attract positively charged particles from the beamlet. In some embodiments, the provided signals can be positive voltages to reflect positively charged particles (or positive ions) and attract electrons from the beamlet.

The pixels may include a set of pixels that are used to influence the directed beamlet. For example, the set of pixels can be configured to shape a profile of the beamlet approaching the set of pixels. Each of the set of pixels in the mirror plate can have a separate voltage control that is configured to establish a voltage in the pixel. The mirror plate is thus programmable in that the voltages can be provided differently for each pixel or set of pixels and can be changed as desired. The provided voltage may generate a customized electric field (e.g., equipotential plane 390 of FIG. 3B), the customized electric field being determined to shape the beamlet profile. Adjustment of the voltage can also change the phase of electrons comprised in the beamlet.

In step 530, the shaped beamlet is reflected by the programmable charged-particle mirror plate to reduce an aberration. The beamlet is reflected above the surface of mirror plate by a voltage applied to pixels on the mirror plate.

In some embodiments, method 500 may further include an additional step of directing the shaped beamlet to a sample surface (e.g., sample surface 370 of FIG. 3A). Prior to reaching the sample surface, the shaped beamlet may be further influenced by an objective lens (e.g., second lens 328 of FIG. 3A), which can be used to focus the shaped beamlet on to the sample surface.

The embodiments may further be described using the following clauses:

1. An apparatus comprising:
   a first set of pixels configured to shape a first beamlet approaching the first set of pixels; and a first set of pixel control members respectively associated with each of the first set of pixels, each pixel control member being arranged and configured to apply a signal to the associated pixel for shaping the first beamlet.

2. The apparatus of clause 1, wherein the first set of pixels has a voltage distribution configured to be adjusted based on a reflection of charged particles associated with the first beamlet above the first sets of pixels.

3. The apparatus of any of clauses 1 or 2, wherein the first beamlet is shaped to cause a reduction of an aberration.

4. The apparatus of any of clauses 1 to 3, wherein the first set of pixels and the first set of pixel control members are implemented in a component.

5. The apparatus of any of clauses 1 to 3, wherein the first set of pixels and the first set of pixel control members are implemented in separate components.

6. The apparatus of any of clauses 1 to 3, wherein each pixel of the first set of pixels and a corresponding pixel control member of the first set of pixel control members are implemented in a component.

7. The apparatus of any of clauses 1 to 3, wherein each pixel of the first set of pixels and a corresponding pixel control member of the first set of pixel control members are implemented in separate components.

8. The apparatus of any of clauses 1 to 7, wherein the signal triggers the associated pixel to generate an electric field for shaping the first beamlet.

9. The apparatus of any of clauses 1 to 7, wherein the first set of pixels is further configured to reflect the shaped first beamlet.

10. The apparatus of any of clauses 1 to 9, wherein the signal comprises a negative voltage to enable the associated pixel to reflect negatively charged particles of the first beamlet or to remove positively charged particles from the first beamlet.

11. The apparatus of any of clauses 1 to 10, wherein the first set of pixels comprises a subset of pixels tilted to remove charged particles from the first beamlet.

12. The apparatus of any of clauses 1 to 9, wherein the signal comprises a positive voltage to enable the associated pixel to reflect positively charged particles of the first beamlet or to remove negatively charged particles from the first beamlet.

13. The apparatus of any of clauses 1 to 12, wherein the signal comprises AC voltage to shape the profile of the first beamlet synchronously with the beam scanning over a sample.

14. The apparatus of any one of clauses 1 to 13, further comprising:
   a second set of pixels configured to shape a second beamlet approaching the second set of pixels; and
   a second set of pixel control members respectively associated with each of the second set of pixels, each pixel control member being arranged and configured to apply a signal to the associated pixel for shaping the second beamlet.

15. The apparatus of clause 14, wherein the first set of pixels and the second set of pixels are part of a mirror plate.

16. The apparatus of clause 14, wherein each of the first set of pixels and second set of pixels comprises a set of rectangular, hexagonal, or ring segment pixels.

17. The apparatus of any of clauses 14 to 16, wherein the first set of pixels and the second set of pixels are arranged in a square or hexagonal pattern.

18. The apparatus of clause 1, wherein the first set of pixels comprises different sizes and shapes of pixels.

19. The apparatus of clause 1, wherein the first set of pixels is disposed on a plate-shaped member, and the plate-shaped member is curved, the curvature of the plate-shaped member is adjusted by mechanical actuators.

20. The apparatus of clause 1, wherein the first set of pixel control members is configured to apply negative voltages, zero, or positive voltages to shape the first beamlet.

21. The apparatus of clause 1, wherein the first set of pixels has a voltage distribution configured to be adjusted based on a landing energy of charged particles associated with the first beamlet.

22. The apparatus of clause 1, wherein the first set of pixels has a voltage distribution configured to be adjusted based on a current of charged particles associated with the first beamlet.

23. The apparatus of clause 1, wherein the first set of pixels has a voltage distribution configured to be adjusted based on a landing angle at a sample.

24. The apparatus of clause 1, wherein the first set of pixels has a voltage distribution configured to be adjusted based on a magnitude of an electric field at a sample.

25. A system for manipulating a charged particle beamlet comprising:
   a source of a beamlet of charged particles; and
   a programmable charged-particle mirror plate arranged to receive the beamlet and configured to shape the beamlet.

26. The system of clause 25, further comprising:
   a plurality of electrodes configured to influence the directed beamlet; and
   a plurality of drivers respectively associated with each of the plurality of electrodes, each driver configured to provide adjustable voltages.

27. The system of clause 25, further comprising:
   a plurality of electromagnetic optical elements, coupled with adjustable excitations, configured to influence the directed beamlet.
   a plurality of drivers respectively associated with each of the plurality of electromagnetic optical elements, each driver configured to adjust excitations of the corresponding electromagnetic optical element.

28. The system of clause 25, further comprising:
   a beam separator configured to direct the beamlet to the programmable charged-particle mirror plate,
   wherein the programmable charged-particle mirror plate can further be configured to direct the shaped beamlet to the beam separator.

29. The system of clause 28, wherein the beam separator is configured to receive and direct multiple beamlets and the programmable charged-particle mirror plate is arranged to receive and reflect the multiple beamlets.

30. The system of clause 25, wherein the programmable charged-particle mirror plate has a plurality of controlled pixels in the mirror plate, each of the multiple beamlets corresponds to an associated set of controlled pixels configured to shape the corresponding beamlet.

31. A method for shaping a beamlet of charged particles, the method comprising:
   directing, using a beam separator, a first beamlet of charged particles towards a charged-particle mirror plate; and shaping, using the charged-particle mirror plate, the first beamlet by providing signals to a first set of pixels of the charged-particle mirror plate to generate an electric field and by reflecting the shaped beamlet.

32. The method of clause 31, wherein the shaped beamlet is directed to the beam separator.

33. The method of clause 31, further comprising:
   directing, using the beam separator, a second beamlet of charged particles towards the charged-particle mirror plate; and
   shaping, using the charged-particle mirror plate, the second beamlet by providing signals to a second set of pixels of the charged-particle mirror plate to generate an electric field and by reflecting the shaped beamlet to the beam separator.

34. A non-transitory computer-readable medium storing a set of instructions that are executable by a controller of an apparatus to cause the apparatus to perform a method to shape a beamlet of charged particles, the method comprising:
   directing, using a beam separator, a first beamlet of charged particles towards a charged-particle mirror plate; and
   shaping, using the charged-particle mirror plate, the first beamlet by providing signals to a first set of pixels of the charged-particle mirror plate to generate an electric field and by reflecting the shaped beamlet to the beam separator.

35. The non-transitory computer-readable medium of clause 34, wherein the set of instructions that are executable by the controller of the apparatus to cause the apparatus to further perform:
   directing, using the beam separator, a second beamlet of charged particles towards the charged-particle mirror plate; and
   shaping the second beamlet by providing signals to a second set of pixels of the charged-particle mirror plate to generate an electric field and reflecting the shaped beamlet to the beam separator by the charged-particle mirror plate.

In some embodiments, a controller may control a charged particle beam system. The controller may include a computer processor. The controller may instruct components of the charged particle beam system to perform various functions, such as controlling the various drivers for manipulating one or more beamlets, for controlling a beam separator for directing beamlets and for controlling voltage control and corresponding pixels of the programmable charged-particle mirror plate. The controller may comprise a storage that is a storage medium such as a hard disk, cloud storage, random access memory (RAM), other types of computer readable memory, and the like. The controller may communicate with a cloud storage. A non-transitory computer readable medium may be provided that stores instructions for a processor of controller 109 to carry out beam forming, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

While the embodiments of the present disclosure have been described in connection with various embodiments, it is appreciated that various modifications and changes can be made without departing from the scope thereof. It is intended that the specification and examples be considered as exemplary only.

The invention claimed is:

1. A charged particle apparatus comprising:
   a mirror plate comprising a first set of pixels configured to shape a first beamlet of charged particles approaching the first set of pixels; and
   a first set of pixel control members respectively associated with each of the first set of pixels, each pixel control member of the first set of pixel control members comprising a voltage control arranged and configured to apply a signal to the associated pixel for shaping the first beamlet, the signal comprising one of a negative voltage or a positive voltage to reflect charged particles associated with the first beamlet,
   wherein the first set of pixels comprises a subset of pixels and a respective subset of pixel control members, wherein the subset of pixel control members is further configured to apply the other of the negative voltage or the positive voltage to the subset of pixels to remove charged particles from the first beamlet.

2. The charged particle apparatus of claim 1, wherein the first set of pixels has a voltage distribution configured to be adjusted based on a reflection of charged particles associated with the first beamlet above the first sets of pixels.

3. The charged particle apparatus of claim 1, wherein the first set of pixels is configured to shape the first beamlet to cause a reduction of an aberration.

4. The charged particle apparatus of claim 1, wherein the first set of pixels and the first set of pixel control members are implemented in a component.

5. The charged particle apparatus of claim 1, wherein the first set of pixels and the first set of pixel control members are implemented in separate components.

6. The charged particle apparatus of claim 1, wherein the signal triggers the associated pixel to generate an electric field for shaping the first beamlet.

7. The charged particle apparatus of claim 1, wherein the signal comprises AC voltage to shape the profile of the first beamlet synchronously with the first beamlet scanning over a sample to reduce or correct for a scanning-dependent change in one of a shape or intensity distribution of the first beamlet.

8. The charged particle apparatus of claim 1, wherein:
   the mirror plate comprises a second set of pixels configured to shape a second beamlet of charged particles approaching the second set of pixels; and
   further comprising a second set of pixel control members respectively associated with each of the second set of pixels, each pixel control member of the second set of pixel control members comprising a voltage control arranged and configured to apply a signal to the associated pixel for shaping the second beamlet.

9. The charged particle apparatus of claim 1, wherein the first set of pixels comprises a further subset of pixels that are tiltable to remove charged particles from the first beamlet.

10. A method for shaping a beamlet of charged particles, the method comprising:
   directing, using a beam separator, a first beamlet of charged particles towards a charged-particle mirror plate;
   shaping, using the charged-particle mirror plate, the first beamlet by providing signals to a first set of pixels of the charged-particle mirror plate to generate an electric field and by reflecting the first beamlet;
   wherein providing the signals to the first set of pixels comprises providing one of a negative voltage or a positive voltage to reflect charged particles associated with the first beamlet, and
   wherein providing the signals comprises further providing, to a subset of the first set of pixels, the other of the negative voltage or the positive voltage, to remove charged particles from the first beamlet.

11. The method of claim 10, wherein the shaped beamlet is directed to the beam separator.

12. The method of claim 10, further comprising:
   directing, using the beam separator, a second beamlet of charged particles towards the charged-particle mirror plate; and
   shaping, using the charged-particle mirror plate, the second beamlet by providing signals to a second set of pixels of the charged-particle mirror plate to generate an electric field and by reflecting the second beamlet to the beam separator.

13. The method of claim 10, further comprising tilting a further subset of the first set of pixels to remove charged particles from the first beamlet.

14. An apparatus comprising:
   a mirror plate comprising a first set of pixels configured to shape a first beamlet of charged particles approaching the first set of pixels; and
   a first set of pixel control members respectively associated with each of the first set of pixels, each pixel control member of the first set of pixel control members comprising a voltage control arranged and configured to apply a signal to the associated pixel for shaping the first beamlet;
   wherein the signal comprises AC voltage to shape the profile of the first beamlet synchronously with the first beamlet scanning over a sample to reduce or correct for a scanning-dependent change in one of a shape or intensity distribution of the first beamlet.

* * * * *